United States Patent
Maesaka et al.

(10) Patent No.: US 9,136,470 B2
(45) Date of Patent: Sep. 15, 2015

(54) MEMORY ELEMENT WITH ION CONDUCTOR LAYER IN WHICH METAL IONS DIFFUSE AND MEMORY DEVICE INCORPORATING SAME

(75) Inventors: Akihiro Maesaka, Kanagawa (JP); Kazuhiro Ohba, Miyagi (JP); Tetsuya Mizuguchi, Kanagawa (JP); Koji Miyata, Kanagawa (JP); Motonari Honda, Kanagawa (JP); Katsuhisa Aratani, Aichi (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 12/957,978

(22) Filed: Dec. 1, 2010

(65) Prior Publication Data

US 2011/0140065 A1 Jun. 16, 2011

(30) Foreign Application Priority Data

Dec. 14, 2009 (JP) .................. 2009-283214

(51) Int. Cl.
  *H01L 45/00* (2006.01)
  *H01L 27/24* (2006.01)

(52) U.S. Cl.
  CPC .......... *H01L 45/085* (2013.01); *H01L 27/2436* (2013.01); *H01L 27/2472* (2013.01); *H01L 45/1266* (2013.01); *H01L 45/146* (2013.01); *H01L 45/1608* (2013.01)

(58) Field of Classification Search
  CPC ....................................................... H01L 45/00
  USPC .................... 257/2, 4, 43, E45.001, E47.001; 438/27, 29, 478, 669, 795
  See application file for complete search history.

(56) References Cited

U.S. PATENT DOCUMENTS

| | | | | |
|---|---|---|---|---|
| 7,307,270 | B2* | 12/2007 | Aratani et al. | 257/2 |
| 2009/0039337 | A1* | 2/2009 | Ohba et al. | 257/4 |
| 2009/0173930 | A1* | 7/2009 | Yasuda et al. | 257/4 |
| 2010/0163823 | A1* | 7/2010 | Sim et al. | 257/2 |

(Continued)

FOREIGN PATENT DOCUMENTS

| | | |
|---|---|---|
| JP | 2002-536840 | 10/2002 |
| JP | 2005-197634 | 7/2005 |

(Continued)

OTHER PUBLICATIONS

Japanese Office Action issued in connection with related Japanese patent application No. 2009-283214 dated Feb. 12, 2014.

(Continued)

*Primary Examiner* — Sheng Zhu
(74) *Attorney, Agent, or Firm* — Dentons US LLP

(57) ABSTRACT

The present invention provides a memory element and a memory device realizing reduced variations in resistance values in an initial state or erase state of a plurality of memory elements and capable of retaining the resistance value in a write/erase state for writing/erasing operations of a plurality of times. The memory element includes a first electrode, a memory layer, and a second electrode in order. The memory layer has: an ion source layer containing at least one of chalcogen elements of tellurium (Te), sulfur (S), and selenium (Se) and at least one metal element selected from copper (Cu), silver (Ag), zinc (Zn), and zirconium (Zr); and two or more high-resistance layers having a resistance value higher than that of the ion source layer and having different compositions.

8 Claims, 9 Drawing Sheets

(56) References Cited

U.S. PATENT DOCUMENTS

2010/0187493 A1* 7/2010 Takahashi ............ 257/4
2014/0131653 A1* 5/2014 Lee et al. ............ 257/4

FOREIGN PATENT DOCUMENTS

| JP | 2006-040946 | 2/2006 |
| JP | 2006-351780 | 12/2006 |
| JP | 2007-165474 | 6/2007 |
| JP | 2009-043757 | 2/2009 |
| JP | 2009-043873 | 2/2009 |
| JP | 2009-130344 | 6/2009 |
| JP | 2009-135206 | 6/2009 |
| JP | 2009-164467 | 7/2009 |
| WO | 00/48196 | 8/2000 |
| WO | WO 2009/051105 | 4/2009 |

OTHER PUBLICATIONS

Japanese Office Examination Report issued in connection with related Japanese patent application No. 2009-283214 dated Dec. 9, 2014.

* cited by examiner

FIG. 4A HAADF-STEM IMAGE

SECOND HIGH-RESISTANCE LAYER Al-O
CuTeAlZr ION SOURCE LAYER
W UPPER ELECTRODE
Gd-O FIRST HIGH-RESISTANCE LAYER
W LOWER ELECTRODE

HAADF-STEM IMAGE

RELATED
ART

50nm

RELATED
ART

W UPPER ELECTRODE

CuTeAlZr ION SOURCE LAYER

Gd-O
FIRST HIGH-
RESISTANCE LAYER

W LOWER ELECTRODE

MEMORY ELEMENT WITH ION CONDUCTOR LAYER IN WHICH METAL IONS DIFFUSE AND MEMORY DEVICE INCORPORATING SAME

BACKGROUND OF THE INVENTION

1. Field of the Invention

The present invention relates to a memory element and a memory device capable of storing information by a change in an electric characteristic of a memory layer including an ion source layer and a high-resistance layer.

2. Description of the Related Art

In information devices such as a computer, as a random access memory, a DRAM (Dynamic Random Access Memory) whose operation is fast and having high density is widely used. However, since the manufacture process of a DRAM is complicated more than a general logic circuit LSI and signal process used for an electronic device, the manufacture cost is high. A DRAM is a volatile memory in which information disappears when power is turned off. A refresh operation, that is, an operation of reading written information (data), amplifying it, and writing the information again has to be performed frequently.

To address the drawback, as nonvolatile memories in which information does not disappear even when power is turned off, for example, a flash memory, an FeRAM (Ferroelectric Random Access Memory), an MRAM (Magnetoresistive Random Access Memory), and the like are proposed. In the case of the memories, written information is continuously retained for long time without supply of power. However, each of the memories has an advantage and a disadvantage. Specifically, a flash memory has high integration but has a disadvantage in operation speed. An FeRAM has limitation in microfabrication for high integration and also has a drawback in manufacturing process. An MRAM has a drawback in power consumption.

A memory element of a novel type which is advantageous particularly with respect to limitation in microfabrication of a memory element is proposed. The memory element has a structure that an ion conductor containing a metal is provided between two electrodes. In the memory element, the metal contained in the ion conductor is contained in one of the two electrodes. With the arrangement, when voltage is applied across the two electrodes, the metal contained in the electrode is diffused as ions into the ion conductor, and the resistance value of the ion conductor or the electric characteristic such as capacitance changes. For example, in Japanese Unexamined Patent Application Publication (Translation of PCT Application) No. 2002-536840, as a memory device using the characteristic, an ion conductor made of a solid solution of chalcogenide and metal is proposed. Concretely, the memory device is made of a material obtained by dissolving Ag, Cu, or Zn in AsS, GeS, or GeSe, and one of two electrodes contains Ag, Cu, or Zn.

SUMMARY OF THE INVENTION

However, in the above-described 1 configuration of related art, in the case of operating a plurality of memory elements, a shortcoming occurs such that variations in resistance values in an initial state or erase state are large among the memory elements. When writing/erasing operation is performed repeatedly, the resistance values in the write state and the erase state become intermediate values between the low resistance state and the high resistance state, and a shortcoming occurs that a sufficient change in the resistance value is not obtained in the following writing/erasing operations.

It is therefore desirable to provide a memory element and a memory device realizing reduced variations in resistance values in an initial state or erase state of a plurality of memory elements and capable of retaining the resistance value in a write/erase state for writing/erasing operations of a plurality of times.

A memory element of an embodiment of the invention has a first electrode, a memory layer, and a second electrode in order, and the memory layer has: an ion source layer containing at least one of chalcogen elements of tellurium (Te), sulfur (S), and selenium (Se) and at least one metal element selected from copper (Cu), silver (Ag), zinc (Zn), and zirconium (Zr); and two or more high-resistance layers having a resistance value higher than that of the ion source layer and having different compositions.

A memory element of another embodiment of the invention has a plurality of memory elements each having a first electrode, a memory layer, and a second electrode in order, and pulse application section that applies a pulse of voltage or current selectively to the plurality of memory elements, and each of the plurality of memory elements is the above-described memory element of an embodiment of the invention.

In the memory element of an embodiment of the invention or the memory device of an embodiment of the invention, when a voltage or current pulse in the "positive direction" (for example, the first electrode side has negative potential and the second electrode side has positive potential) is applied to the element in the initial state (high resistance state), the metal element contained in the ion source layer is ionized and ions are diffused into the high-resistance layer and coupled with electrons on the first electrode and deposited, or remain in the high-resistance layer to form an impurity level. The conduction path containing the metal element is formed in the memory layer, and resistance in the high-resistance layer becomes low (write state). When the voltage pulse is applied in the "negative direction" (for example, the first electrode side has positive potential, and the second electrode side has negative potential) to the element in the low resistance state, the metal element deposited on the first electrode is ionized and dissolved in the ion source layer. Consequently, the conduction path containing a metal element disappears, and the resistance of the high-resistance layer becomes high (the initial state or erase state).

Since the memory layer is provided with two or more high-resistance layers whose compositions are different from each other, a defect (a region in which electric resistance is locally low) existing in one of the high-resistance layer is corrected by the other high-resistance layer, and uniformity of the structure of the high-resistance layers improves. Therefore, variations in the resistance values in the initial state or erase state of the plurality of memory elements are reduced. Also in the case of repeatedly performing writing/erasing operation, increase in defects in the high-resistance layer is suppressed, and the possibility of loss of the function as a barrier in electric conduction of the high-resistance layer is reduced. Therefore, the resistance value retention characteristic for writing/erasing operation of a plurality of times improves.

According to the memory element and the memory device of embodiment of the present invention, two or more high-resistance layers whose compositions are different from each other are provided in the memory layer. Consequently, variations in resistance values in an initial state or erase state of a plurality of memory elements are reduced, and the resistance value retention characteristic for the writing/erasing operations of a plurality of times is increased.

Other and further objects, features and advantages of the invention will appear more fully from the following description.

BRIEF DESCRIPTION OF THE DRAWINGS

FIGS. 4A and 4B are an HAADF-STEM image and a schematic diagram of the memory element according to an example of the invention.

DETAILED DESCRIPTION OF THE PREFERRED EMBODIMENTS

An embodiment of the invention will be described in detail below with reference to the drawings.

Memory Element

Figure 1:
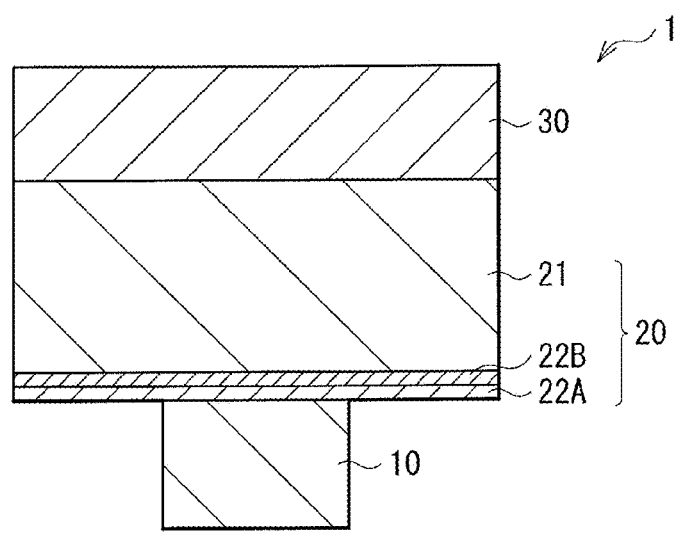
FIG. 1 is a cross section illustrating the configuration of a memory element according to an embodiment of the present invention.

FIG. 1 is a sectional configuration diagram of a memory element 1 according to an embodiment of the invention. The memory element 1 has a lower electrode 10 (first electrode), a memory layer 20, and an upper electrode 30 (second electrode) in order.

The lower electrode 10 is, for example, provided on a silicon substrate 41 in which a CMOS (Complementary Metal Oxide Semiconductor) circuit is formed as will be described later (FIG. 2) and serves as a connection to a CMOS circuit section. The lower electrode 10 is made of a wiring material used for a semiconductor process, such as W (tungsten), WN (tungsten nitride), Cu (copper), Al (Aluminum), Mo (molybdenum), Ta (tantalum), silicide, or the like. In the case where the lower electrode 10 is made of a material such as copper (Cu) in which ion conduction may be caused by electric field, the surface of the lower electrode 10 made of copper (Cu) or the like may be coated with a material suppressing ion conduction and thermal diffusion such as tungsten (W), tungsten nitride (WN), titanium nitride (TiN), or tantalum nitride (TaN).

The memory layer 20 has an ion source layer 21, a first high-resistance layer 22A, and a second high-resistance layer 22B. The ion source layer 21 is provided in contact with the upper electrode 30, and contains, as a metal element which may serve as a cation, at least one of copper (Cu), silver (Ag), zinc (Zn), and zirconium (Zr) and, as an ion conduction material which may serve as an anion, at least one or two of chalcogen elements of tellurium (Te), sulfur (S), and selenium (Se). The metal element and the chalcogen element are coupled to form a metal chalcogenide layer. The metal chalcogenide layer has, mainly, an amorphous structure and plays the role of an ion supply source.

Preferably, the ion source layer 21 contains zirconium (Zr) as a metal element which may serve as a cation for a reason that a resistance value retention characteristic in a low resistance state (writing state) or a high resistance state (initial state or erasure state) is improved. The low resistance state is defined as a writing state, and the high resistance state is defined as an erasure state.

Further, the ion source layer 21 preferably contains Al (aluminum) and/or Ge (germanium) as an element for forming an oxide at the time of erasure. It forms a stable oxide to stabilize the high resistance state (erasure state) and contribute to increase in the number of repetition times.

Concrete materials of the ion source layer 21 are, for example, ion source layer materials having composition of CuZrTeAl or CuZrTeAlGe.

The content of aluminum (Al) in the ion source layer 21 is, for example, 30 to 50 atomic % both inclusive. The content of zirconium (Zr) in the ion source layer 21 is, preferably, 7.5 to 26 atomic % both inclusive and, further, the composition ratio of zirconium (Zr) to the total of the chalcogen element contained in the ion source layer 21 (=Zr (atomic %)/total of the chalcogen element (atomic %)) lies in the range of 0.2 to 0.74 both inclusive. The content of Ge in the ion source layer 21 is preferably 15 atomic % or less. With such a configuration, the role of each of elements is displayed maximally. The details will be described later.

Another element may be added to the ion source layer 21 for the purpose of, for example, suppressing peeling-off of the memory layer 20 at the time of high-temperature heat treatment. For example, silicon (Si) is an additive element with which improvement in the retention characteristic is also expected. Preferably, silicon is added together with zirconium (Zr) in the ion source layer 21. However, when the addition amount of silicon (Si) is too small, a film peel-off preventing effect is not expected. When the addition amount is too large, a preferable memory operation characteristic is not obtained. Therefore, the content of silicon (Si) in the ion source layer 21 is desirably in the range of about 10 to 45 atomic %.

The memory layer 20 has a stack structure of the first and second high-resistance layers 22A and 22B. The first and second high-resistance layers 22A and 22B have the function of barrier in electric conduction, have a resistance value higher than that of the ion source layer 21, and have compositions different from each other. With the configuration, in the memory element 1, variations in the resistance value in the initial state or the erase state of the plurality of memory elements 1 are reduced, and resistance values in the initial/erase state are retained in writing/erasing operations of a plurality of times.

Specifically, one of causes that variations in the resistance value in the initial state or the erase state become large when the plurality of memory elements 1 are operated is nonuniformity of the structure of the high-resistance layer made by an oxide thin film. Uniformity of the structure of an oxide thin film largely depends on morphology such as roughness of an underlayer and wettability of an element of the oxide and the underlayer. For example, in the case where roughness of the underlayer is large, a region in which adhesion of an oxide material is insufficient at the time of film formation becomes a defect. As a result, a region in which electric resistance is locally low is formed. In the case where the writing/erasing operation is repeatedly performed on the memory element, a defect tends to increase in a region where electric resistance is low in the oxide thin film. As a result, the role of barrier in electric conduction is not played.

However, in the case where variations in manufacture are considered, it is difficult to perfectly and uniformly control the morphology of the underlayer, so that the memory layer 20 having tolerance in the form of the underlayer and the manufacture conditions has to be formed. Consequently, in the embodiment, by providing the first and second high-resistance layers 22A and 22B whose compositions are different from each other so as to be in contact with each other (stacked) in the memory layer 20, a defect existing in the first high-resistance layer 22A is corrected by the second high-resistance layer 22B, thereby improving uniformity of the structure of the first and second high-resistance layers 22A and 22B.

In the case of depositing a high-resistance layer by sputtering on a very rough underlayer, an effect of turning to the underlayer varies depending on the material deposited. In this point as well, by providing the first and second high-resistance layers 22A and 22B whose compositions are different from each other so as to be in contact with each other (stacked) in the memory layer 20, an effect of suppressing a defect which occurs at the time of film deposition is expected.

Preferably, such first and second high-resistance layers 22A and 22B are made of an oxide or nitride containing at least one element out of a group of rare-earth elements of yttrium (Y), lanthanum (La), neodymium (Nd), samarium (Sm), gadolinium (Gd), terbium (Tb), and dysprosium (Dy) or an oxide or nitride containing at least one element out of a group of silicon (Si), aluminum (Al), titanium (Ti), and hafnium (Hf). A film which is relatively flat in nm level is obtained.

Preferably, the first and second high-resistance layers 22A and 22B are made of an oxide or nitride containing elements whose physical properties such as atomic weights and atomic radii are different from each other or an oxide or nitride having different properties such as wettability to the ion source layer 21 for a reason that a larger correcting effect is obtained.

Concretely, in the case where the first high-resistance layer 22A is made of gadolinium oxide (Gd—O), preferably, the second high-resistance layer 22B is made of a nitride or oxide of aluminum (Al) or silicon (Si) (aluminum oxide (Al—O) or silicon oxide (Si—O)).

In this case, the first high-resistance layer 22A made of gadolinium oxide (Gd—O) contributes to formation of a conduction path so that it is preferably provided in contact with the lower electrode 10. The second high-resistance layer 22B made of a nitride or oxide of aluminum (Al) or silicon (Si) is provided between the first high-resistance layer 22A and the ion source layer 21. With the arrangement, a defect in the gadolinium oxide (Gd—O) film is buried with aluminum (Al) or silicon (Si) having an atomic radius smaller than that of gadolinium (Gd).

The material of the first high-resistance layer 22A is not limited to gadolinium oxide (Gd—O) but may be a material with which impurity level is generated and a low resistance state is formed by ions of a metal element supplied from the ion source layer 21 by voltage bias, such as an oxide or nitride of aluminum (Al) or silicon (Si). In this case as well, by providing the second high-resistance layer 22B whose physical properties such as atomic weight and atomic radius are different from those of the first high-resistance layer 22A, or having a property such as wettability different from that of the ion source layer 21, effects similar to the above are obtained.

The upper electrode 30 is made of a wiring material used in a known semiconductor process similar to that of the lower electrode 10.

In the memory element 1 of the embodiment, when a voltage pulse or current pulse is applied from a not-shown power source (pulse applying means) via the lower electrode 10 and the upper electrode 30, the electric characteristic, for example, the resistance value of the memory layer 20 changes, thereby performing writing, erasing, and reading of information. The operation will be described concretely below.

First, a positive voltage is applied to the memory element 1 so that, for example, the upper electrode 30 has positive potential and the lower electrode 10 has negative potential. Consequently, the metal element contained in the ion source layer 21 is ionized, and ions are diffused into the second and first high-resistance layers 22B and 22A and coupled with electrons on the lower electrode 10 side and deposited. As a result, a conduction path (filament) of the metal element of low resistance reduced to a metal state is formed in the interface between the lower electrode 10 and the memory layer 20, or the metal element ionized remains in the second and first high-resistance layers 22B and 22A and forms the impurity level. The conduction path is formed in the second and first high-resistance layers 22B and 22A, the resistance value of the memory layer 20 decreases, and the high resistance state as the initial state changes to the low resistance state.

After that, even when the positive voltage is eliminated and no voltage is applied to the memory element 1, the low resistance state is held. It means that information is written. In the case of using the memory element 1 for a memory device in which information is allowed to be written only once, that is, a PROM (Programmable Read Only Memory), recording is completed only by the writing process. On the other hand, to apply the memory element 1 to an erasable memory device, that is, a RAM (Random Access Memory), an EEPROM (Electronically Erasable and Programmable Read Only Memory), or the like, an erasing process is necessary. In the erasing process, a negative voltage is applied to the memory element 1 so that, for example, the upper electrode 30 has negative potential and the lower electrode 10 has positive potential. By the application, the metal element of the conduction path formed in the memory layer 20 is ionized, ions are soluble in the ion source layer 21 or coupled to tellurium (Te) or the like, thereby forming a compound such as $Cu_2Te$ or CuTe. Thereby, the conduction path of a metal element is disappeared or decreased and the resistance value increases. Alternatively, an oxide film is formed on the anode electrode by the additive element such as aluminum (Al) or germanium (Ge) existing in the ion source layer 21, and the state changes to the high resistance state.

After that, even when the negative voltage is eliminated and no voltage is applied to the memory element 1, the high resistance state is held. As a result, written information becomes erasable. By repeating such a process, writing of information in the memory element 1 and erasure of written information are allowed to be performed repeatedly.

For example, when a state where the resistance value is high is associated with information of "0" and a state where the resistance value is low is associated with information of "1", the information is changed from "0" to "1" in the process of writing information by application of positive voltage, and is changed from "1" to "0" in the process of erasing information by application of negative voltage.

To erase written data, the higher the ratio between the resistance value in the initial state and that after writing information is, the more it is preferable. In the case where the resistance value of the high-resistance layer is too large, it becomes difficult to write information, that is, to lower resistance, and the write threshold voltage becomes too high, so that the initial resistance value is adjusted to 1 GΩ or less. For example, in the case where the first high-resistance layer 22A or the second high-resistance layer 22B is made of an oxide of a rare-earth element, the resistance values of the first high-resistance layer 22A and the second high-resistance layer 22B are controlled by the thickness, the amount of oxygen contained, or the like.

Since the memory layer 20 is provided with the first and second high-resistance layers 22A and 22B whose compositions are different from each other, a defect (a region in which electric resistance is locally low) existing in the first high-resistance layer 22A is corrected by the second high-resistance layer 22B, and the uniformity in the structure of the first and second high-resistance layers 22A and 22B improves. Therefore, variations in the resistance value in the initial state or the erase state of the plurality of memory elements 1 are reduced. Also in the case where the writing/erasing operation is performed repeatedly, increase in defects in the first and second high-resistance layers 22A and 22B is suppressed, and the possibility of loss of the function as the barrier in the electric conduction of the first and second high-resistance layers 22A and 22B decreases. Therefore, the resistance value retention characteristic for the writing/erasing operation of a plurality of times improves.

Further, in the embodiment, as described above, preferably, the ion source layer 21 contains zirconium (Zr), aluminum (Al), germanium (Ge), or the like. The reason will be described below.

In the case where zirconium (Zr) is contained in the ion source layer 21, zirconium (Zr) functions as an ionization element together with a metal element such as copper (Cu), and a conduction path in which zirconium (Zr) and the above-described metal element such as copper (Cu) mixedly exist is formed. It is considered that zirconium (Zr) is reduced on the cathode electrode at the time of writing operation and, in a low resistance state after writing, forms a filament in the metal state. Since the metal filament obtained by reducing zirconium is relatively difficult to be soluble in the ion source layer 21 containing the chalcogen element such as sulfur (S), selenium (Se), or tellurium (Te), in the case where the state once becomes the write state, that is, the low resistance state, the low resistance state is held more easily than the case of the conduction path made of the single metal element such as copper (Cu). For example, copper (Cu) is formed as a metal filament by the writing operation. However, copper (Cu) in the metal state is soluble in the ion source layer 21 containing the chalcogen element. In a state where a write voltage pulse is not applied (a data retention state), copper (Cu) is ionized again, and the state shifts to the high resistance state. Consequently, sufficient data retention performance is not obtained. On the other hand, combination of zirconium (Zr) and a proper amount of copper (Cu) promotes an amorphous state and keeps the microstructure of the ion source layer 21 uniform, so that it contributes to improvement in the resistance value retention performance.

Also with respect to retention of a high resistance state at the time of erasure, in the case where zirconium (Zr) is contained, for example, when a conduction path of zirconium (Zr) is formed and again dissolved as ions in the ion source layer 21, since the ion mobility of zirconium (Zr) is lower than that of at least copper (Cu), even temperature rises or when left for long time, zirconium (Zr) does not move easily. Consequently, deposition in the metal state on the cathode electrode does not easily occur. Since a zirconium (Zr) oxide is stable in a chalcogenide electrolyte, the oxide does not easily deteriorate, and the high resistance state is maintained also in a state where temperature is higher than room temperature or in the case where the oxide is held for long time.

Further, in the case where aluminum (Al) is contained in the ion source layer 21, by forming a stable oxide film in the interface between the ion source layer 21 behaving like a solid electrolyte and the anode electrode at the time of erasing operation, the high resistance state (erase state) is stabilized. In addition, it contributes also to increase in the number of repetition times from the viewpoint of self-regeneration of the high-resistance layer. That is, aluminum (Al) in the ion source layer 21 acts so as to form an oxide film at the time of erasure. On the other hand, aluminum (Al) in the second high-resistance layer 22B corrects a defect in the first high-resistance layer 22A, thereby always maintaining a coupling state. Except for aluminum (Al), germanium (Ge) displaying a similar function or the like may be contained.

In the case where zirconium (Zr), aluminum (Al), germanium (Ge) or the like is contained in the ion source layer 21, the resistance value retaining performance is displayed in a wider range as compared with an existing memory element, the writing/erasing high-speed operation performance improves, and the number of repetition times increases. Further, when an intermediate state between the high resistance state and the low resistance state is created by adjusting erasure voltage at the time of changing, for example, from low resistance to high resistance, the state is maintained stably. Therefore, not only a binary memory but also a multivalued memory are realized.

Important characteristics in memory operation such as a write/erasure operation characteristic of applying such a voltage, a resistance value retaining characteristic, and the number of repetition operation times vary according to the addition amounts of zirconium (Zr), copper (Cu), aluminum (Al), and germanium (Ge).

For example, when the content of zirconium (Zr) is too much, the resistance value of the ion source layer 21 decreases excessively so that a valid voltage is not applied to the ion source layer 21 or it becomes difficult to dissolve zirconium (Zr) in a chalcogenide layer. Due to this, it becomes difficult to erase information, a threshold voltage of erasure rises according to the content of zirconium (Zr) and, when the content is too much, it becomes difficult to write information, that is, to realize low resistance. On the other hand, when the addition amount of zirconium (Zr) is too little, the effect of improving the resistance value retention characteristic of a wide range is lessened. Therefore, the content of zirconium (Zr) in the ion source layer 21 is preferably 7.5 atomic % or more and, preferably, 26 atomic % or less.

In the case of adding a proper amount of copper (Cu) in the ion source layer 21, an amorphous state is promoted. However, when the amount of copper (Cu) is excessive, since stability of copper (Cu) in the metal state in the ion source layer 21 containing the chalcogen element is insufficient, the write retention characteristic deteriorates, and an adverse influence is exerted on high speed of the writing operation. On the other hand, the combination of zirconium (Zr) and copper (cu) produces an effect that an amorphous material is easily formed and the microstructure of the ion source layer 21 is maintained uniformly. It prevents the material components in the ion source layer 21 from becoming non-uniform due to the repetitive operation, so that the number of repetition times increases, and the retention characteristic also improves. In the case where the zirconium (Zr) amount is contained sufficiently within the above-described range, even if the conduction path of copper (Cu) is dissolved again in the ion source layer 21, it is considered that the conduction path of metal zirconium (Zr) remains, so that no influence is exerted on the write retention characteristic. Since it is sufficient to maintain the equivalent relation of charge amounts of cations and anions in a dissociated and ionized state, it is considered that a preferable additive amount of copper (Cu) is obtained when the equivalent ratio of ion charges lies in the range of {(Zr maximum ion valence×mole number or atomic %)+(Cu ion valence×mole number or atomic %)}/(ion valence of chalcogen element×mole number or atomic %)=0.5 to 1.5.

The characteristic of the memory element 1 substantially depends on the composition ratio of zirconium (Zr) and tellurium (Te). Consequently, it is desirable that the composition ratio of zirconium (Zr) and tellurium (Te) lies in the range of Zr composition ratio (atomic %)/Te composition ratio (atomic %)=0.2 to 0.74. Although it is not clear, since the degree of dissociation of copper (Cu) is lower than that of zirconium (Zr) and the resistance value of the ion source layer 21 is determined by the composition ratio of zirconium (Zr) and tellurium (Te), a preferable resistance value is obtained as long as the composition ratio lies in the range. It is therefore considered that bias voltage applied to the memory element 1 is effectively applied to the part of the first and second high-resistance layers 22A and 22B.

In the case where the value is out of the range, for example, in the case where the equivalent ratio is too high, the cations and anions are not balanced, and the amount of an element which is not ionized in existing metal elements increases. It is considered that, due to this, the conduction path generated by the writing operation is not efficiently removed in the erasing operation. Similarly, in the case where the equivalent ratio is too low and the anion elements exist excessively, the conduction path in a metal state generated by the writing operation does not easily exist in a metal state, so that the retention performance in the write state deteriorates.

When the content of aluminum (Al) is too large, ions of aluminum (A) tend to move, and the write state is created by reduction of the ions of aluminum (Al). Since the stability of the metal state of aluminum (Al) in a solid electrolyte of chalcogenide is low, the low-resistive write state retention performance deteriorates. On the other hand, when the amount of aluminum (Al) is too small, the effect of improving the erasing operation itself or the high-resistive state retention characteristic becomes low, and the number of repetition times decreases. Therefore, the content of aluminum (Al) is preferably 30 atomic % or higher and, more preferably, 50 atomic % or less.

Although germanium (Ge) does not have to be contained, in the case where the content of germanium (Ge) is too large, the write retention characteristic deteriorates. Therefore, the content of germanium (Ge) added is preferably 15 atomic % or less.

A method of manufacturing the memory element 1 of the embodiment will be described below.

First, on a substrate in which a CMOS circuit such as a selection transistor is formed, the lower electrode 10 made of, for example, tungsten (W) is formed. After that, as necessary, the oxide or the like on the surface of the lower electrode 10 is removed by inverse sputtering or the like.

Subsequently, for example, by DC magnetron sputtering, a metal gadolinium (Gd) film is formed with a thickness of 1.0 nm. By oxidizing the metal gadolinium (Gd) film with oxygen plasma, the first high-resistance layer 22A made of gadolinium oxide (Gd—O) is formed. The volume of the metal gadolinium (Gd) film increases when the film is oxidized and, as a result, the thickness of the first high-resistance layer 22A becomes, for example, 1.5 nm.

After that, for example, by DC magnetron sputtering, the ion source layer 21 made of $Cu_{15}Te_{30}Zr_{15}Al_{30}$ and having a thickness of 45 nm is formed. In the memory layer 20, excessive oxygen in the first high-resistance layer 22A made of gadolinium oxide (Gd—O) is coupled to aluminum (Al) in the ion source layer 21, and an aluminum oxide (Al—O) layer is formed in a Gd—O/CuTeZrAl interface between the first high-resistance layer 22A and the ion source layer 21. The thickness of the aluminum oxide (Al—O) layer is, for example, 0.7 nm. The aluminum oxide (Al—O) layer serves as the second high-resistance layer 22B.

The second high-resistance layer 22B made of aluminum oxide (Al—O) may be formed by, after forming the first high-resistance layer 22A, depositing an aluminum (Al) as the material to form an aluminum (Al) film and oxidizing the aluminum (Al) film. However, as described above, by making the aluminum (Al) element as the material of the second high-resistance layer 22B contained in the ion source layer 21, the memory layer 20 including the second high-resistance layer 22B is formed easily without introducing the process of forming the second high-resistance layer 22B. The thickness of the aluminum oxide (Al—O) layer as the second high-resistance layer 22B is controlled by strength of plasma oxidization parameters ($O_2$ atmosphere pressure and input power) on the gadolinium oxide (Gd—O) of the first high-resistance layer 22A.

After formation of the ion source layer 21 and the second high-resistance layer 22B, the upper electrode 30 made of, for example, tungsten (W) is formed on the ion source layer 21. In such a manner, a stack film of the lower electrode 10, the memory layer 20, and the upper electrode 30 is formed.

After formation of the stack film, the first high-resistance layer 22A, the second high-resistance layer 22B, the ion source layer 21, and the upper electrode 30 in the stack film are patterned by plasma etching or the like. The patterning may be performed by an etching method such as, in addition to plasma etching, ion milling, RIE (Reactive Ion Etching), or the like.

After patterning the stack film, a wiring layer connected to the upper electrode 30 is formed, and a contact part for obtaining the potential common to all of the memory elements 1 is connected. After that, heat treatment is performed on the stack film. By the above processes, the memory element 1 shown in FIG. 1 is completed.

In the embodiment as described above, the memory layer 20 is provided with the first and second high-resistance layers 22A and 22B having different compositions. Consequently, uniformity in the structures of the first and second high-resistance layers 22A and 22B is improved, variations in the resistance values in the initial state or the erase state of the plurality of memory elements 1 are reduced, and the resistance value retention characteristic for the writing/erasing operation of a plurality of times is increased.

Since zirconium (Zr), aluminum (Al), germanium (Ge), and the like are contained in the ion source layer 21, the data retention characteristic is excellent. As miniaturization advances, also in the case where current drive force of a transistor becomes smaller, information is retained. Therefore, by constructing a memory device using the memory element 1, higher density and miniaturization is realized. Any of the lower electrode 10, the first and second high-resistance layers 22A and 22B, the ion source layer 21, and the upper electrode 30 is made of a material which is sputtered, so that the manufacturing process is simplified. That is, it is sufficient to sequentially perform sputtering using a target adapted to the material of each layer. By exchanging targets in the same sputtering apparatus, films may be successively formed.

Memory Device

By arranging a number of memory elements, for example, in a column shape or a matrix, a memory device (memory) is configured. As necessary, a MOS transistor for element selection or a diode is connected to each of the memory elements to form a memory cell, and the memory cell is connected to a sense amplifier, an address decoder, a write/erase/read circuit, or the like via a wiring.

Figure 2:
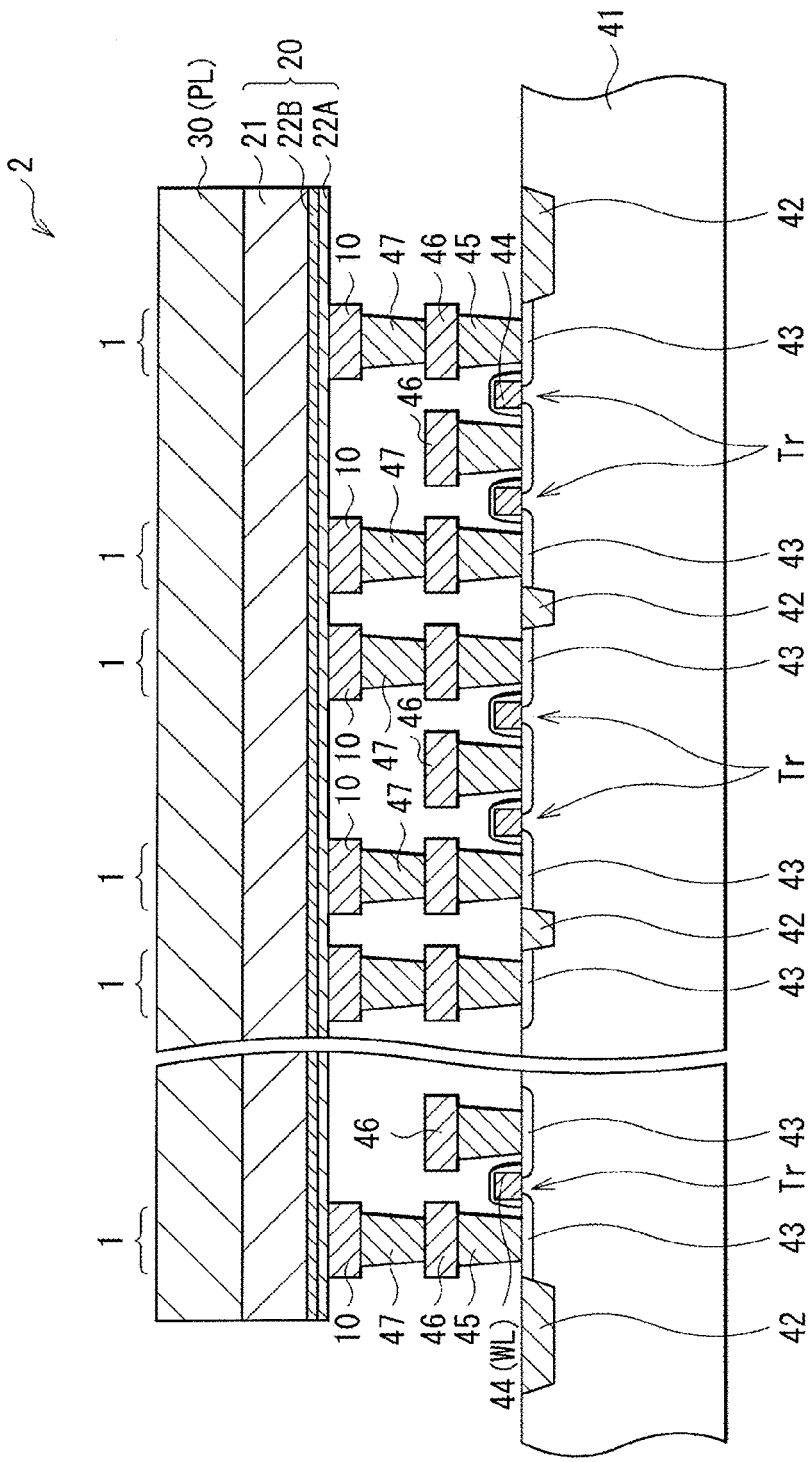
FIG. 2 is a cross section illustrating a schematic configuration of a memory cell array using the memory element in FIG. 1.
Figure 3:
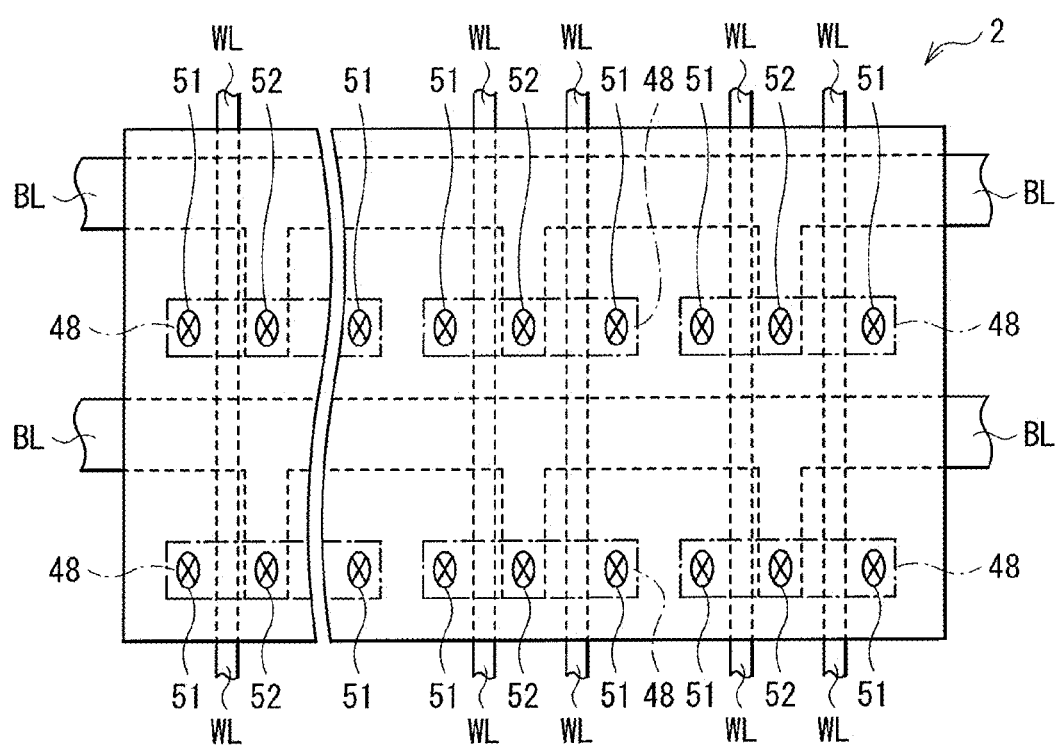
FIG. 3 is a plan view of the memory cell array.

FIGS. 2 and 3 illustrate an example of a memory device (memory cell array 2) in which a number of memory elements 1 are disposed in a matrix. FIG. 2 illustrates a sectional configuration, and FIG. 3 illustrates a planar configuration. In the memory cell array 2, a wiring connected to the bottom electrode 10 side and a wiring connected to the upper electrode 30 side are provided so as to cross each other for each memory element 1. For example, each memory element 1 is disposed near the cross point of the wirings.

The memory elements 1 share the first and second high-resistance layers 22A and 22B, the ion source layer 21, and the upper electrode 30. That is, each of the first and second high-resistance layers 22A and 22B, the ion source layer 21, and the lower electrode 30 is a layer (the same layer) common to the memory elements 1. The upper electrode 30 serves as a plate electrode PL common to neighboring cells.

On the other hand, the lower electrode 10 is provided individually for each memory cell. The lower electrodes 10 in adjacent cells are electrically isolated from each other, and the memory element 1 of each memory cell is specified in a position corresponding to each lower electrode 10. The lower electrode 10 is connected to a corresponding MOS transistor Tr for cell selection, and each memory element 1 is provided above the MOS transistor Tr.

The MOS transistor Tr is made by a source/drain region 43 and a gate electrode 44 formed in regions isolated by an element isolation layer 42 in the semiconductor substrate 41. On wall faces of the gate electrode 44, a sidewall insulating layer is formed. The gate electrode 44 also serves as a word line WL as one of address lines of the memory element 1. One of the source/drain regions 43 of the MOS transistor Tr, and the lower electrode 10 of the memory element 1 are electrically connected with a plug layer 45, a metal wiring layer 46, and a plug layer 47 in between. The other one of the source/drain regions 43 is connected to the metal wiring layer 46 with the plug layer 45 in between. The metal wiring layer 46 is connected to a bit line BL (refer to FIG. 3) as the other address line of the memory element 1. In FIG. 3, an active region 48 in the MOS transistor Tr is shown by a chain line, and a contact part 51 is connected to the lower electrode 10 of the memory element 1, and a contact part 52 is connected to the bit line BL.

In the memory cell array 2, when the gate of the MOS transistor Tr is set to the on state by the word line WL and voltage is applied to the bit line BL, the voltage is applied to the lower electrode 10 of a selected memory cell via the source/drain of the MOS transistor Tr. In the case where the polarity of the voltage applied to the lower electrode 10 is negative potential with respect to the potential of the top electrode 30 (plate electrode PL), the resistance value of the memory element 1 changes to a low resistance state, thereby writing information in the selected memory cell. Next, when a voltage of the positive potential with respect to the potential of the upper electrode 30 (plate electrode PL) is applied to the lower electrode 10, the resistance value of the memory element 1 changes again to a high resistance state, thereby erasing the information written in the selected memory cell. To read written information, for example, a memory cell is selected by the MOS transistor Tr and predetermined voltage or current is applied to the cell. The current or voltage which varies according to the resistance state of the memory element 1 is detected via a sense amplifier or the like connected to the bit line BL or the plate electrode PL. The voltage or current applied to the selected memory cell is set to be smaller than a threshold of the voltage or the like which varies according to the state of the resistance value of the memory element 1.

The memory element of the embodiment is applicable to various memory devices. It is applicable to any memory form such as a PROM (Programmable Read Only Memory) in which information may be written only once, an EEPROM (Electronically Erasable and Programmable Read Only Memory), a RAM to/from which information may be written/erased/reproduced at high speed, or the like.

EXAMPLES

A concrete example of the present invention will be described below.

Example

The memory element 1 illustrated in FIG. 1 was fabricated in a manner similar to the foregoing embodiment. First, a metal gadolinium (Gd) film was formed with a thickness of 1.0 nm by DC magnetron sputtering on the lower electrode 10 made of tungsten (W). Subsequently, the metal gadolinium (Gd) film was oxidized for ten seconds by RF plasma with parameters of chamber pressure of 1 mTorr (0.133 Pa), $O_2$ atmosphere, and input power of 500 W, the first high-resistance layer 22A made of gadolinium oxide (Gd—O) was formed. By the oxidation, the volume of the metal gadolinium (Gd) film increased. As a result, the thickness of the first high-resistance layer 22A became 1.5 nm.

After that, by DC magnetron sputtering, the ion source layer 21 made of $Cu_{15}Te_{30}Zr_{15}Al_{30}$ was formed with thickness of 45 nm. In the memory layer 20, excessive oxygen in the first high-resistance layer 22A made of gadolinium oxide (Gd—O) was coupled to aluminum (Al) in the ion source layer 21, and an aluminum oxide (Al—O) layer was formed in a Gd—O/CuTeZrAl interface between the first high-resistance layer 22A and the ion source layer 21. The thickness of the aluminum oxide (Al—O) layer was, for example, 0.7 nm. The aluminum oxide (Al—O) layer served as the second high-resistance layer 22B.

After formation of the ion source layer 21 and the second high-resistance layer 22B, the upper electrode 30 made of tungsten (W) was formed on the ion source layer 21. In such a manner, the memory element 1 illustrated in FIG. 1 was obtained.

Comparative Example

A memory element was fabricated in a manner similar to the above example except that the second high-resistance layer is not included. On a lower electrode made of tungsten (W), a high-resistance layer made of gadolinium oxide (Gd—O) was formed with a thickness of 2.0 nm. The high-resistance layer was formed by forming a metal gadolinium (Gd) film with a thickness of 1.3 nm by DC magnetron sputtering and, after that, oxidizing the metal gadolinium (Gd) film for ten seconds by RF plasma with parameters of chamber pressure of 1 mTorr (0.133 Pa), $O_2$ atmosphere, and input power of 500 W. Subsequently, the ion source layer 21 made of $Cu_{25}Te_{50}Zr_{25}$ was formed with thickness of 45 nm. After that, the upper electrode made of tungsten (W) was formed.

Analysis of Sectional Structure

To analyze sectional structures of the memory elements of the example and the comparative example obtained, structure analysis was conducted with a transmission electron microscope. For the structure analysis, a section of the memory element 1 was subjected to thin film process by FIB (Focused Ga Ion Beam) etching.

Figure 4B:
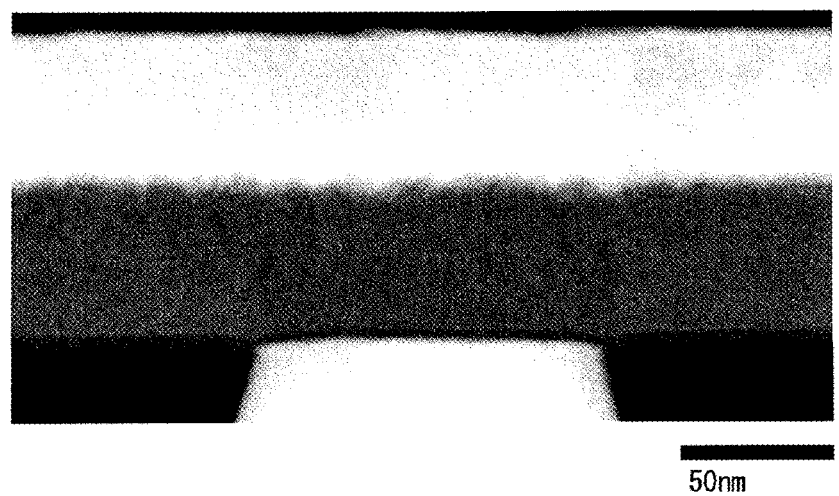
Figure 5A:
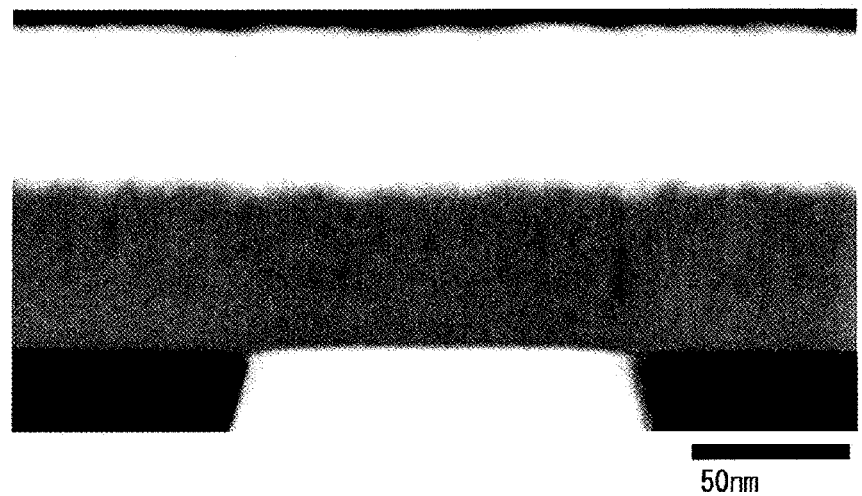
FIGS. 5A and 5B are an HADDF-STEM image and a schematic diagram of a memory element according to a comparative example of the invention.
Figure 5B:
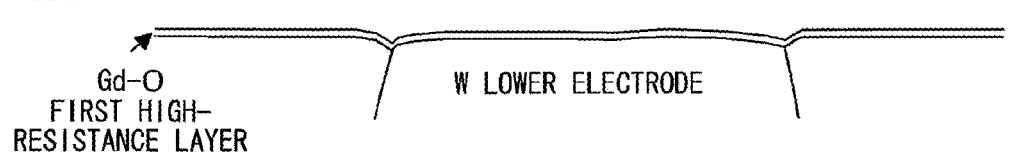

FIG. 4A illustrates an HAADF-STEM (High-Angle Annular Dark-Field Scanning Transmission Electron Microscope) image of a section of the memory element 1 according to the example, and FIG. 4B is a structure schematic diagram for explaining the HAADF-STEM image of the example illustrated in FIG. 4A. FIG. 5A illustrates an HADDF-STEM image of a section of the memory element according to the comparative example, and FIG. 5B is a structure schematic diagram for explaining the HAADF-STEM image of the comparative example illustrated in FIG. 5A. The contrast of the HAADF-STEM image is inversely proportional to the square of an atomic number. A material made of an element having a larger atomic number is observed with a higher contrast.

Figure 6A:
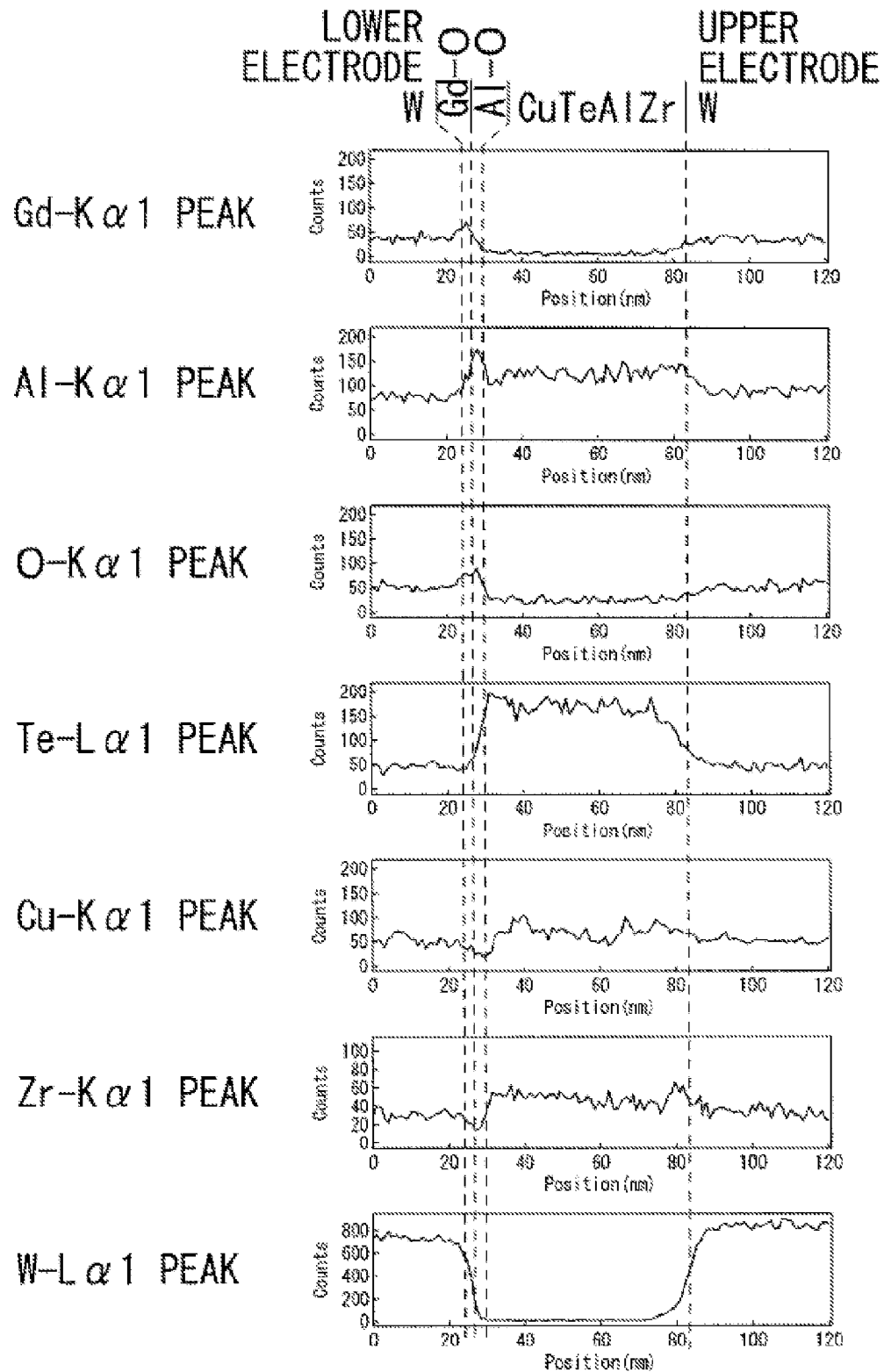
FIGS. 6A and 6B are diagrams illustrating EDX measurement results of memory elements according to the example and the comparative example.
Figure 6B:
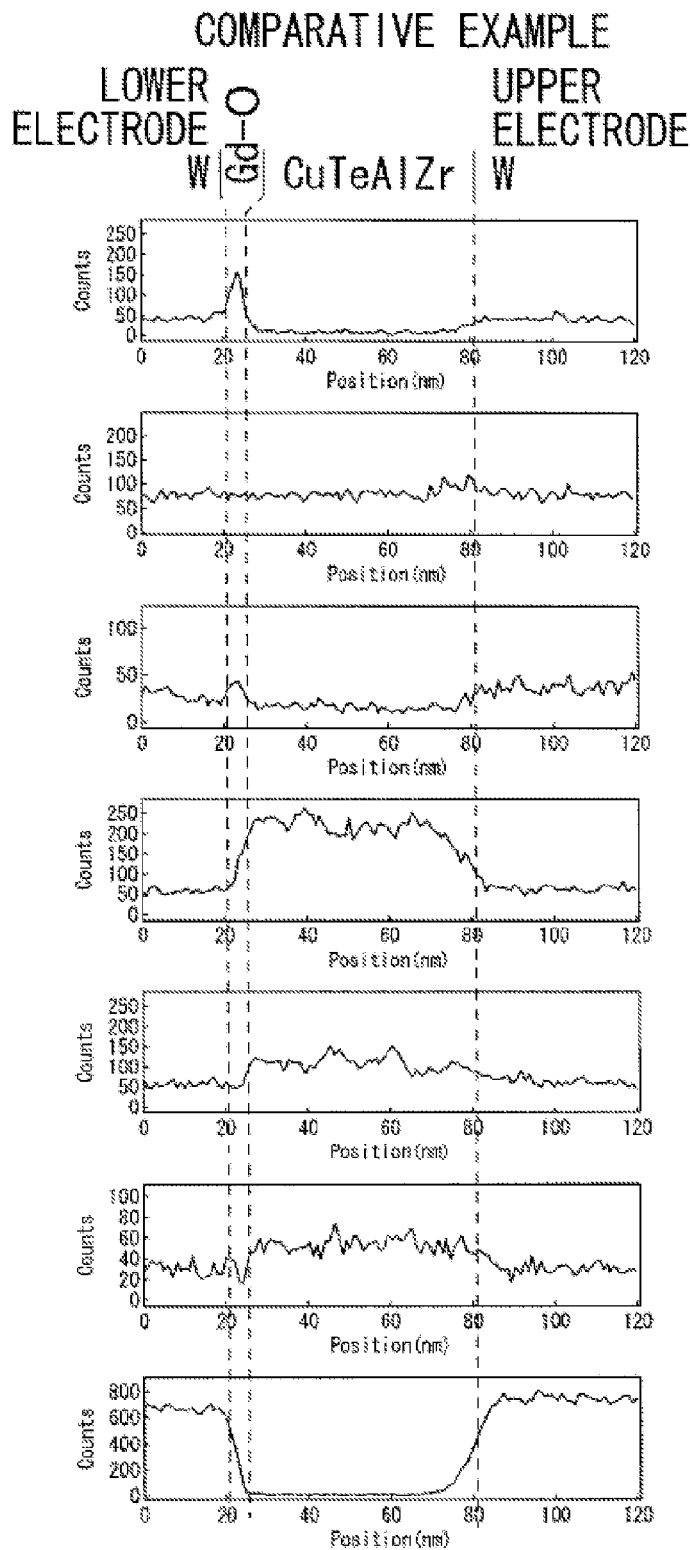

FIGS. 6A and 6B illustrate EDX measurement results of the sections of the memory elements according to the example and the comparative example, respectively. In the EDX measurement, while scanning electron beams condensed to a diameter of about 1 nm on a sectional sample at intervals of 1 nm, EDX spectrum at points were obtained. An EDX line profile result is obtained by plotting integrated intensities at the Gd-L$\alpha$1 peak, Al—K$\alpha$1 peak, O—K$\alpha$1 peak, Te-L$\alpha$1 peak, Cu—K$\alpha$1 peak, Zr—K$\alpha$1 peak, and W-L$\alpha$1 peak. The integrated intensity at each peak is a value including a noise component in the background.

As understood from FIG. 6A, in the example, the peaks of aluminum (Al) and oxygen (O) were observed in the interface between the first high-resistance layer made of gadolinium oxide (Gd—O) and the ion source layer made of CuTeAlZr, and it was confirmed that an aluminum oxide (Al—O) film as the second high-resistance layer was formed.

On the other hand, in the comparative example, as understood from FIG. 6B, since the element (aluminum (Al)) which becomes the material of the second high-resistance layer is not contained in the ion source layer, it was confirmed that an oxide layer having the function of the second high-resistance layer is not formed in the interface between a high-resistance layer made of gadolinium oxide (Gd—O) and the ion source layer made of CuTeZr.

Initial Resistance Value

Figure 7A:
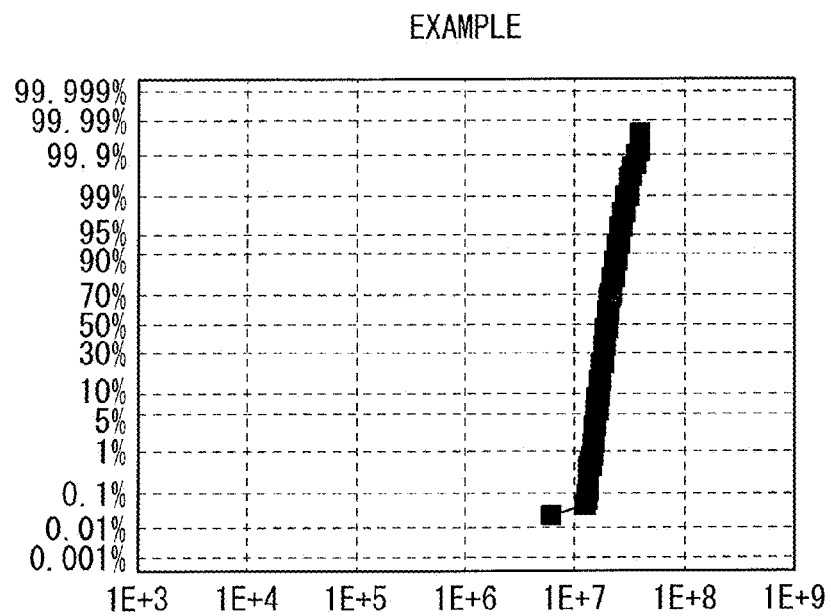
FIGS. 7A and 7B are diagrams illustrating cumulative frequency distributions of initial resistance values of the memory elements according to the example and the comparative example.
Figure 7B:
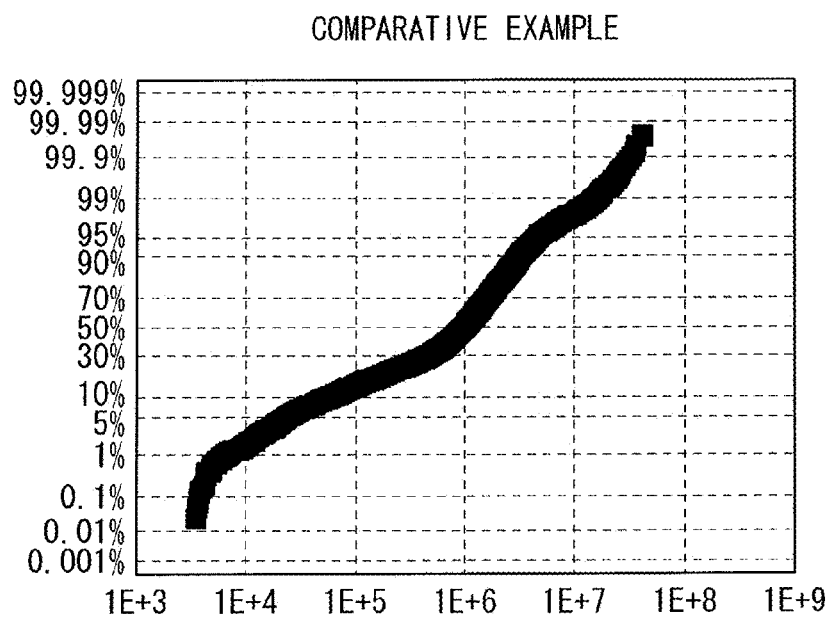

FIGS. 7A and 7B illustrate cumulative frequency distributions of initial resistance values of the memory elements (4 kbits) manufactured in the example and the comparative example, respectively. The initial resistance of the memory element manufactured in the comparative example has a wide distribution of a few k$\Omega$ to tens M$\Omega$. On the other hand, the initial resistance of the memory element manufactured in the example is 10 M$\Omega$ to tens M$\Omega$. The variations in the resistance value were reduced as compared with the comparative example.

It was therefore known that by providing the memory layer 20 with the first and second high-resistance layers 22A and 22B whose compositions are different from each other, variations in the resistance value in the initial state or the erase state of the plurality of memory elements 1 are reduced.

Repetition Characteristic

Figure 8A:
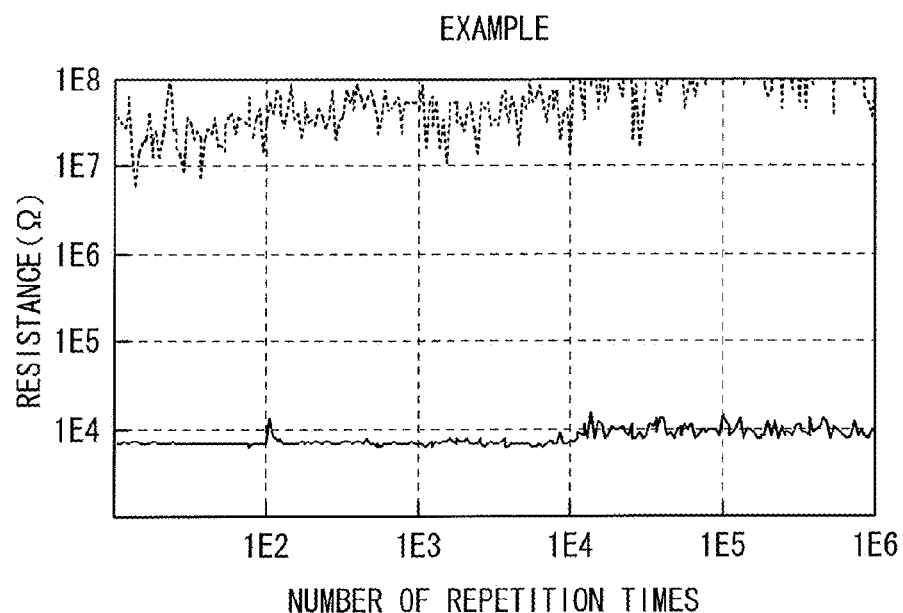
FIGS. 8A and 8B are diagrams illustrating resistance values after performing writing and erasing operations on the memory elements according to the example and the comparative example.
Figure 8B:
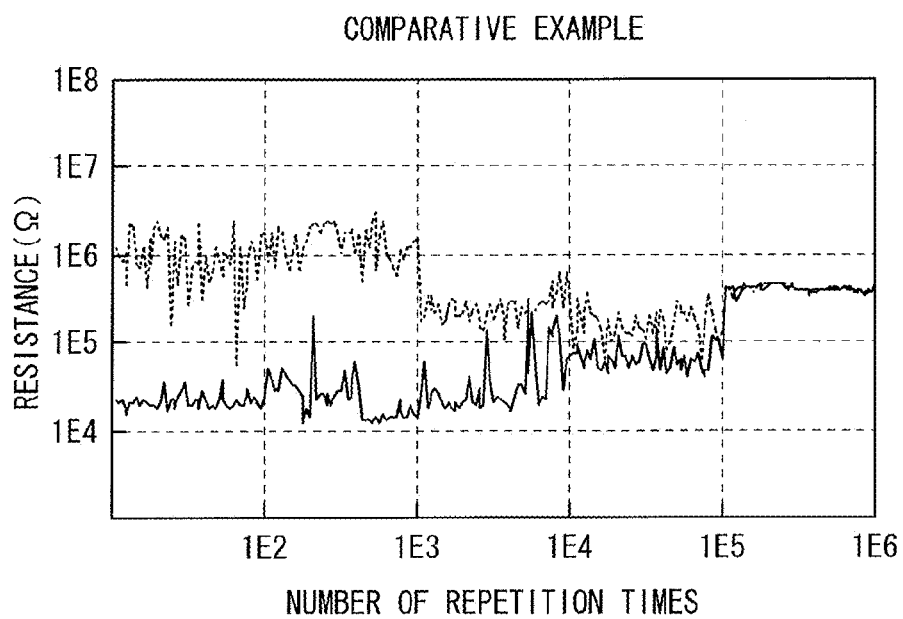

FIGS. 8A and 8B illustrate results of plotting resistance values obtained after repeatedly performing writing and erasing operations on the memory elements according to the example and the comparative example with respect to the number of repetition times. In the writing operation, −3V (pulse width 10 nsec) was applied to the bottom electrode. In the erasing operation, +2V (pulse width 10 nsec) was applied to the lower electrode.

As understood from FIG. 8B, in the comparative example, as the number of repetition times increases, the resistance values in the write state and the erase state become intermediate values between the low resistance state and the high resistance state, and a sufficient change in the resistance value is not obtained for the writing/erasing operation. On the other hand, as understood from FIG. 8A, in the example, with repetition of 10^6 times, the resistance values in the write state and the erase state maintain apart from each other. The repetition characteristic is much improved as compared with that of the comparative example.

That is, it was understood that by providing the memory layer 20 with the first and second high-resistance layers 22A and 22B whose compositions are different from each other, the resistance value retention characteristic for the writing/erasing operations of a plurality of times is increased.

Although the present invention has been described by the embodiment and the examples, the invention is not limited to the embodiment and the examples but may be variously modified.

For example, in the foregoing embodiment and examples, the case of providing the first and second high-resistance layers 22A and 22B in the memory layer 20 has been described. Alternatively, three or more high-resistance layers whose compositions are different from one another may be provided. With the configuration, a defect in the high-resistance layers is corrected with higher precision. However, as the number of high-resistance layers increases, the device resistance increases. Consequently, there is the possibility that voltage for recording rises. In reality, it is desirable to reduce variations in the resistance value in the initial state or the erase state with the minimum number of high-resistance layers. Like the first and second high-resistance layers 22A and 22B, preferably, the third and subsequent high-resistance layers are made of an oxide or nitride containing at least one element out of a group of rare-earth elements of yttrium (Y), lanthanum (La), neodymium (Nd), samarium (Sm), gadolinium (Gd), terbium (Tb), and dysprosium (Dy) or an oxide or nitride containing at least one element out of a group of silicon (Si), aluminum (Al), titanium (Ti), and hafnium (Hf). In this case as well, preferably, high-resistance layers adjacent in the stack direction are made of an oxide or nitride containing elements whose physical properties such as atomic weights and atomic radii are different from each other or an oxide or nitride having different properties such as wettability to the ion source layer 21 for a reason that a larger correcting effect is obtained.

For example, in the foregoing embodiment, the configuration of the memory element 1 and the memory cell array 2 has been concretely described. It is not necessary to have all of the layers or another layer may be further provided.

For example, the invention is not limited to the materials of the layers, the film forming methods, the film formation parameters, and the like described in the foregoing embodiment and examples. Other materials or other film forming methods may be employed. For example, to the ion source layer 21, in the range of the composition ratio, another transition metal element such as titanium (Ti), hafnium (Hf), vanadium (V), niobium (Nb), tantalum (Ta), chromium (Cr), molybdenum (Mo), or tungsten (W) may be added. In addition to copper (Cu), silver (Ag) or zinc (Zn), nickel (ni) or the like may be added.

The present application contains subject matter related to that disclosed in Japanese Priority Patent Application JP 2009-283214 filed in the Japanese Patent Office on Dec. 14, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element comprising:
a first electrode;
a second electrode; and
a memory layer between the first and second electrodes, wherein,
 (a) the memory layer comprises
  (1) an ion source layer containing at least one of chalcogen elements of tellurium (Te), sulfur (S), and selenium (Se) and at least one metal element selected from copper (Cu), silver (Ag), zinc (Zn), and zirconium (Zr); and
  (2) two or more high-resistance layers having a resistance value higher than that of the ion source layer and having different compositions with respect to each other,
 (b) upon application of a first voltage across the first and second electrodes, metal ions diffuse into the high-resistance layers thereby effecting a detectable change in an electrical characteristic of the memory element,
 (c) upon application of a second voltage with a polarity different than that of the first voltage across the first and second electrodes, the metal ions dissolve in the ion source layer and the change in the electrical characteristic of the memory element is reversed,
 (d) the two or more high-resistance layers include (i) a first high-resistance layer which is in contact with a surface of the first electrode that faces the second electrode and extends over the entire first electrode, and (ii) a second high-resistance layer which lies between the first high-resistance layer and the ion source layer;
 (e) both of the first and second high resistance layers affect the change in the electrical characteristic of the memory element, and
 (f) only the first high-resistance layer is in contact with the first electrode.

2. The memory element according to claim 1, wherein each of the two or more high-resistance layers is made of an oxide or nitride containing at least one element out of a group of rare-earth elements of yttrium (Y), lanthanum (La), neodymium (Nd), samarium (Sm), gadolinium (Gd), terbium (Tb), and dysprosium (Dy) or an oxide or nitride containing at least one element selected from a group of silicon (Si), aluminum (Al), titanium (Ti), and hafnium (Hf).

3. The memory element according to claim 1, wherein the first high-resistance layer is made of gadolinium oxide (Gd—O), and the second high-resistance layer is made of a nitride or oxide of aluminum (Al) or silicon (Si).

4. The memory element according to claim 1, wherein a resistance value is changed when a conduction path containing the metal element is formed in the memory layer by application of the first voltage to the first and second electrodes.

5. The memory element according to claim 1, wherein the ion source layer contains aluminum (Al).

6. A memory device comprising:
a plurality of memory elements each having a first electrode, a second electrode and a memory layer between the first and second electrodes; and
a pulse application section that applies a pulse of voltage or current selectively to the plurality of memory elements, wherein,
 (a) each memory layer comprises
  (1) an ion source layer containing at least one of chalcogen elements of tellurium (Te), sulfur (S), and selenium (Se) and at least one metal element selected from copper (Cu), silver (Ag), zinc (Zn), and zirconium (Zr); and
  (2) two or more high-resistance layers having a resistance value higher than that of the ion source layer and having different compositions with respect to each other,
 (b) upon application of a first voltage across the first and second electrodes of a memory element, metal ions diffuse into the high-resistance layers thereby effecting a detectable change in an electrical characteristic of the memory element,
 (c) upon application of a second voltage with a polarity different than that of the first voltage across the first and second electrodes of the memory element, the metal ions dissolve in the ion source layer and the change in the electrical characteristic of the memory element is reversed,
 (d) the two or more high-resistance layers include (i) a first high-resistance layer which is in contact with a surface of the first electrode that faces the second electrode and extends over the entire first electrode, and(ii) a second high-resistance layer which lies between the first high-resistance layer and the ion source layer;
 (e) both of the first and second high resistance layers affect the change in the electrical characteristic of the memory element, and
 (f) only the first high-resistance layer is in contact with the first electrode.

7. The memory device according to claim 6, wherein at least one of the layers of the memory layer is common to all of the memory elements.

8. The memory device according to claim 7, wherein the two or more high-resistance layers are common to all of the memory elements and each memory element has a unique first electrode, second electrode and ion source layer.

* * * * *